United States Patent [19]

Mens et al.

[11] Patent Number: 5,019,778
[45] Date of Patent: May 28, 1991

[54] MAGNETIC RESONANCE APPARATUS WITH AN OPTIMIZED DETECTION FIELD

[75] Inventors: Wilhelmus R. M. Mens; Jan Konijn, both of Eindhoven, Netherlands

[73] Assignee: U.S. Philips Corporation, New York, N.Y.

[21] Appl. No.: 426,335

[22] Filed: Oct. 24, 1989

[30] Foreign Application Priority Data

Oct. 24, 1988 [NL] Netherlands ......................... 8802609

[51] Int. Cl.$^5$ .............................................. G01R 33/20
[52] U.S. Cl. ..................................... 324/322; 324/318
[58] Field of Search ............... 324/318, 320, 322, 307, 324/309

[56] References Cited

U.S. PATENT DOCUMENTS

| | | | |
|---|---|---|---|
| 4,591,818 | 5/1986 | Butson | 324/320 |
| 4,712,067 | 12/1987 | Roschmann et al. | 324/318 |
| 4,725,781 | 2/1988 | Röschmann | 324/318 |
| 4,725,782 | 2/1988 | Oppelt et al. | 324/322 |
| 4,737,718 | 4/1988 | Kemner et al. | 324/322 |
| 4,799,016 | 1/1989 | Rezvani | 324/322 |
| 4,839,595 | 6/1989 | Boskamp | 324/318 |

FOREIGN PATENT DOCUMENTS 3616706 11/1987 Fed. Rep. of Germany .
171439 9/1985 Japan ...................... 324/318

OTHER PUBLICATIONS

J. C. Watkins et al., "High Pass Bird-Cage Coil for Nuclear-Magnetic Resonance", Rev. Sci. Instrum., vol. 59, No. 6, Jun. 1988, pp. 926-929.

*Primary Examiner*—Michael J. Tokar
*Attorney, Agent, or Firm*—William Squire

[57] ABSTRACT

In an rf coil of a magnetic resonance apparatus steps are taken to optimize a uniform rf measuring field. To this end, axially extending current conductors are provided with means for generating a non-constant effective current intensity in current paths extending across a cylindrical surface so as to be parallel with a symmetry axis of the coil. This can be realized by deflecting axial conductors away from the cylindrical surface, by partly shielding them, by adding auxiliary coils to be individually controlled, or by connecting L-C circuits across the current conductors.

10 Claims, 2 Drawing Sheets

MAGNETIC RESONANCE APPARATUS WITH AN OPTIMIZED DETECTION FIELD

BACKGROUND OF THE INVENTION

The invention relates to a magnetic resonance apparatus, comprising a magnet system for generating a steady magnetic field, a gradient magnet system, and an rf coil system which comprises an rf coil in which mutually parallel current paths extending axially across a cylindrical surface can be introduced, and also relates to a method of designing an rf coil for such an apparatus.

A magnetic resonance apparatuses of this kind is known from EP 213 665 which corresponds to U.S. Pat. No. 4,737,718. The apparatus described therein comprises a bird-cage rf coil which is composed of two ring conductors which are interconnected by way of a number of axial extending longitudinal wires which extend parallel to one another and parallel to a symmetry axis and which are situated on a cylinder defined by the ring conductors. When impedances and reactances are suitably chosen, a spatially uniform rf field can be generated in the coil by means of a cosine wave applied to the ring conductors.

U.S. Pat. No. 4,712,067 describes an rf coil which is composed of a number (for example two) of saddle-shaped coils whereby, using a suitable mutual coupling and correct control, a spatially uniform rf field can be generated in a mode which depends on the control and the mutual orientation of the current conductors. Current conductors which extend mutually parallel and parallel to a symmetry axis again form active longitudinal wires of the coil which are situated on a cylindrical surface.

EP 218 290 which corresponds to U.S. Pat. No. 4,839,595 describes an rf coil in the form of a so-called surface coil. Such a coil comprises a current conductor which is situated in one plane and through longitudinal wires of which there extends an imaginary cylinder, on a cylindrical surface of which the longitudinal wires extend in the axial direction so as to be mutually parallel and parallel to a symmetry axis. A plurality of such coils can be combined as described so as to form a butterfly coil.

In the types of coil described therein an rf field having a reasonably spatial homogeneity can be generated in a space which is enclosed by the current conductor or which is defined thereby and spin resonance signals can be detected from such space. The dimension of the rf measuring field space is determined by the geometry of the coil and will always be smaller than a space defined by the geometry of the coil. The filling factor which is to understood to mean herein, the part of the space in which the rf field is sufficiently uniform and which forms part of the geometrically defined space, can be increased in the radial direction by using a larger number of longitudinal conductors. Inter alia because a larger radius of a cylindrical coil makes the coil space more accessible, an acceptable solution can be found, at the expense of a higher energy consumption. In the axial direction the filling factor is reduced by increasing the diameter while maintaining the axial length of the coil; a smaller diameter makes the coil less accessible. When the length of the coil is increase, the rf measuring field space becomes larger but more energy will be consumed and the patient load will increased at areas where the load is not effectively used.

Homogeneity of rf coils for MR apparatus is important both for uniform excitation of spins and for uniform reception sensitivity for spin signals.

In addition, for transmitter coils it is important, from a point of view of rf power supply, and for receiver coils it is important from a point of view of signal-to-noise ratio that the rf coil has a sensitivity which is as compatible as possible with the space in which MR takes place. This implies a high filling factor. Known coils all exhibit a substantial dispersion field in the direction of the main axis. The ideal field profile of an rf coil is a block: sensitive only in the center and insensitive outside the center.

Because coils have a finite length in practice and are not bounded by an ideally conductive shield, the amplitude will always decrease towards the edge and the field will project outside the geometrical coil volume.

The transverse homogeneity is dependent on the number of current conductors situated on the circumference of the coil. In contemporary coils the current intensity in the conductors is cosinusoidal modulated as a function of the circumferential angle. The current intensity in a conductor, however, is constant. Thus, the homogeneity in non-central transverse planes is poor and the profile of the field along the main axis necessitates a long coil which, however, will have a poor filling factor. Homogeneity and field definition are in principle incompatible and are even contradictory in conventional coils.

SUMMARY OF THE INVENTION

It is an object of the invention to mitigate the above drawbacks; to achieve this, a magnetic resonance apparatus of the kind set forth in accordance with the invention is characterized in that an rf coil comprises current conductors for generating a non-constant current intensity, measured in current paths which extend mutually parallel and parallel to a symmetry axis of the coil.

Because in a magnetic resonance apparatus axially extending current conductors of an rf coil are be oriented or constructed so that non-constant current intensities can be generated in current paths which extend parallel to a symmetry axis of the coil and hence on a cylindrical surface, the rf field can be positively influenced as regards field homogeneity near both axial ends of the coil system, without the basic shape of the coil requiring modification.

In a preferred embodiment, current conductors near one or both axial ends of the coil do not extend parallel to an axial symmetry axis of the coil, so that a constant current intensity through the conductors introduces a non-constant current intensity in a conductor path extending parallel to the symmetry axis, so that an optimized rf field can be generated.

In a further embodiment this is achieved by partly shielding longitudinal wires or by locally providing one or more additional coils, which are possibly operated in phase opposition.

In a further embodiment this is achieved by partly shielding aerial wires or by locally providing one or more additional coils, which are possibly operated in phase opposition.

In a further embodiment, L-C circuits are connected across current conductors so that the current intensity can be locally adjusted in longitudinal wires which are now situated on a cylindrical surface, taken in the axial direction. Using such a circuit for each longitudinal wire, for example three or more paths of different current intensity can be introduced, preferably but not necessarily an odd number of paths being formed for symmetry reasons.

For calculating an optimum current intensity distribution in longitudinal wires, and hence for designing an optimized rf coil, a block function can be taken as the ideal shape of the rf field on the z-axis, that is to say for a coil where the field is generated substantially by the axial conductors and hence no contribution is made by the ring conductors. Each axial longitudinal conductor of the rf coil contributes to the rf field in the same way. Improvement of the z-axis profile of the conductor, therefore, also benefits the entire coil. The field profile of a current in the direction of the z-axis and taken at a distance ½ D from the axis can be calculated using known relationships such as Biot-Savart's law and Fourier analysis to determine the current distribution required in the current paths for a given field profile.

Any arbitrary field shape can then be generated by means of a current intensity distribution so determined. When the ideal block profile is chosen, a complex current function is obtained. By choosing a less strictly localized field function, the current function is simplified. On the other hand, a simple current function produces only a limited approximation of an ideal field profile. The effect of an external ground shield can be simply taken into account in the calculation.

BRIEF DESCRIPTION OF THE DRAWING

Some preferred embodiments in accordance with the invention will be described in detail hereinafter with reference to the drawing. Therein.

DETAILED DESCRIPTION OF THE PREFERRED EMBODIMENTS

Figure 1:
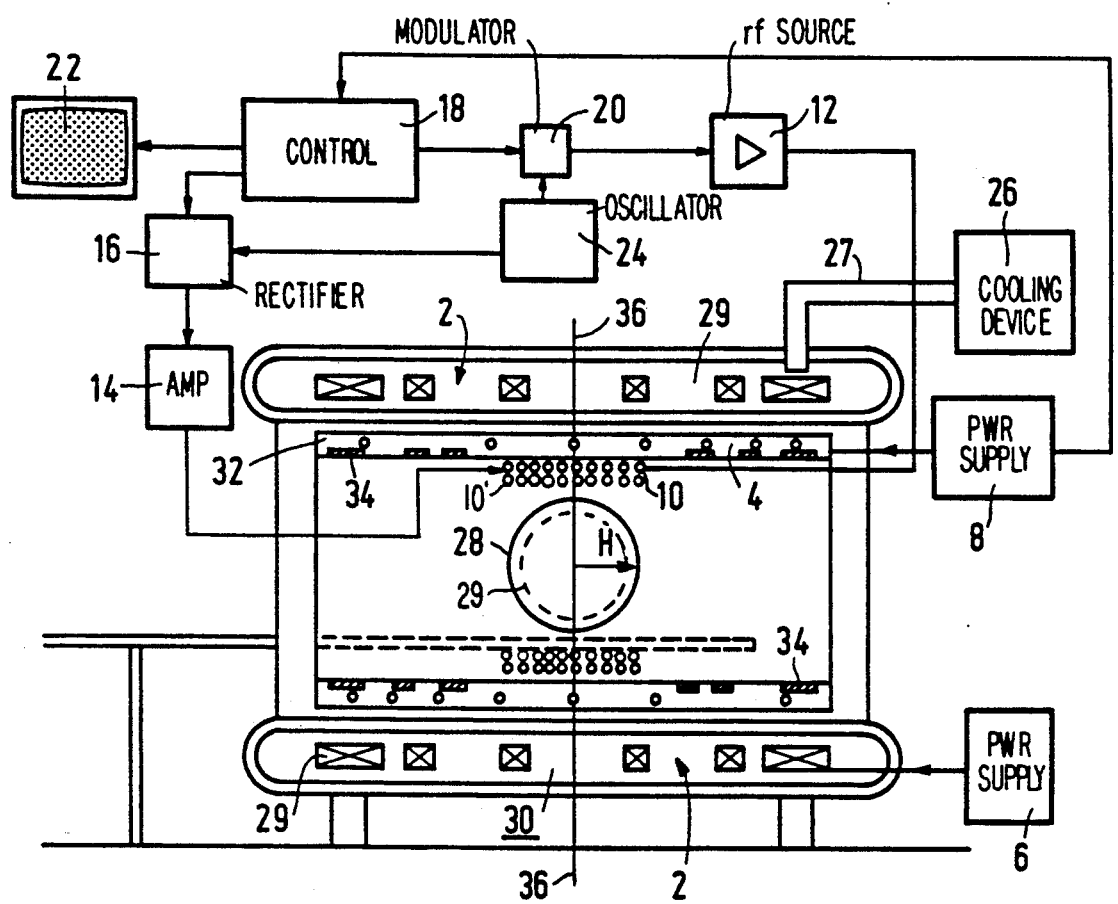
FIG. 1 diagrammatically shows a magnetic resonance apparatus including an rf coil in accordance with an embodiment of the invention, FIGS. 2 and 3 respectively show current intensity and field distributions in a prior art rf coil and in an rf coil according to the present invention.

A magnetic resonance apparatus as shown in FIG. 1 comprises a magnet system 2 for generating a uniform, steady magnetic field, a magnet system 4 for generating magnetic gradient fields, and power supply sources 6 and 8 for the magnet system 2 and the magnet system 4, respectively. A magnet coil 10 for generating an rf magnetic field is connected to an rf source 12. The coil 10 can also be used for the detection of magnetic resonance signals generated by the rf transmitted field in an object to be examined to this end it is connected to a signal amplifier 14. The signal amplifier 14 is connected to a phase sensitive rectifier 16 which is connected to a central control device 18. The central control device 18 also controls a modulator 20 for the rf source 12, the power supply source 8 for the gradient coils, and a monitor 22 for display. An rf oscillator 24 applies an rf signal to the modulator 20 as well as the phase sensitive rectifier 16 which processes the measurement signals. For cooling, if any, there may be provided a cooling device 26 comprising cooling ducts 27. Such a cooling device may be constructed as a water cooling system for resistive coils or as a liquid helium and/or nitrogen Dewar system for superconducting coils, for example as described in commonly owned copending application Ser. No. 347,599 entitled "Superconductive Magnet System Comprising Superconductive Cylinders" filed May 2, 1989 in the name of Overweg et al. The coil 10 arranged within the magnet systems 2 and 4 encloses a measuring space 28 which offers sufficient space to accommodate patients or parts thereof to be examined in an apparatus for medical diagnostic measurements. Thus, in the measuring space 28 a steady magnetic field, gradient fields for position selection of slices to be imaged and a spatially uniform rf alternating field can be generated and detected. An optional surface coil 29 is shown in dashed lines in space 28 and which can be constructed to include an embodiment of the invention. The surface coil is a bird cage coil in this embodiment but may be of other configurations such as shown in U.S. Pat. No. 4,839,595, incorporated by reference herein.

Figure 2:
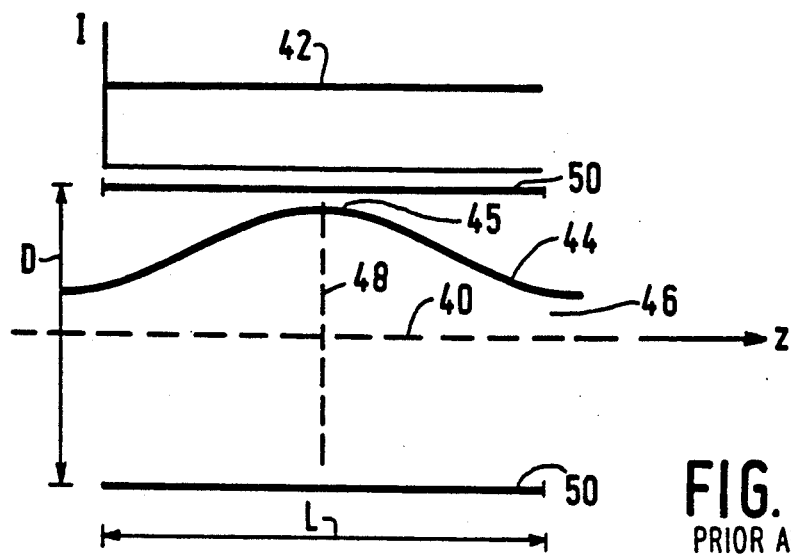

FIG. 2 shows a symmetry axis 40 of a known rf birdcage coil having a length L and a diameter D, and also shows a transverse rf field 44 along the z-axis as a function of z which has been generated with a constant current distribution 42. The field variation is only diagrammatically shown; however, in this respect it is relevant that for customary ratios of L and D, for example L = D in bird-cage coils, the field is bell-shaped with no more than a slightly flattened apex 45 and a substantial dispersion field 46 outside the coil. Measured in a symmetry plane 48, the field may exhibit a reasonable homogeneity, notably in a central part of the coil, when the number of longitudinal wires 50 extending parallel to the longitudinal axis of the coil is not too small.

Figure 3:
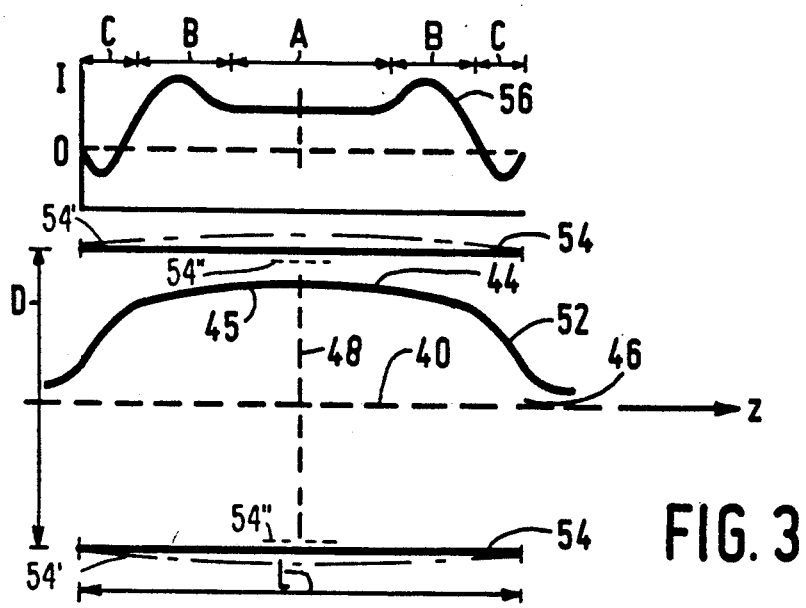
Figure 4:
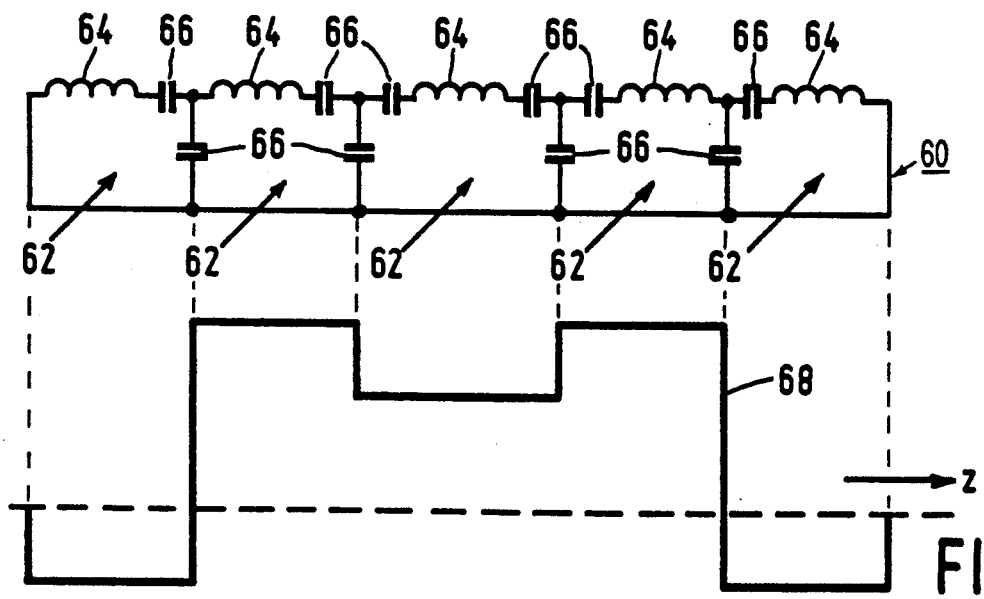
FIG. 4 shows a circuit diagram and corresponding field contribution for an rf coil according to the present invention.

FIG. 3 shows and rf bird cage coil in accordance with the invention which again has a length L and a diameter D, a field distribution 44 with a comparatively long flat apex 45 and comparatively steep edges 52, so that the dispersion field 46 outside the coil is comparatively small. In order to generate such a field, a current intensity variation 56 of the shape shown is required in a current path 54 Which extends parallel to the symmetry axis 40. This current intensity variation can be calculated on the basis of the given, in that case, actually desired field distribution and the geometry of the coil. If the desired current variation is known for a current path which extends parallel to the symmetry axis and an example of which is represented by the curve 56 in FIG. 3, a current conductor generating this current can be determined. The latter can be realized by the positioning of a longitudinal current conductor, i.e. by imparting a course thereto which deviates from the parallel course with the longitudinal axis as shown in FIG. 3 by conductors 54', the current intensity in the conductor being constant, or by constructing a parallel current conductor or providing it with electronic means such as shown in FIG. 4 so that the desired current intensity variation occurs therein. Alternatively, use can be made of a combination of the two methods, which may result in comparatively little distortion and comparatively simple electrical means. Electrical means are to be understood to include herein also the addition of local axially extending auxiliary coils 10', FIG. 1, and the partial shielding of current conductors as represented by dashed lines 54" in FIG. 3.

On the basis of the current intensity distribution 56 in FIG. 3, a first approximation of a current conductor, is given, for example by a mirror-image geometry of the current conductor with respect to the current intensity distribution, the longitudinal wires extending at a distance from the symmetry axis in a central part A which is greater than that in the part B as shown by the broken line 54'. The negative current variation in the parts C can be realized, as shown in FIG. 4, for example by means of an auxiliary coil such as coil 10', FIG. 1, operating in phase opposition and which is coupled via a loop. The desired current variation in the paths A and B can also be realized by locally shielding, e.g., shielding 54'', a longitudinal wire, i.e. a partial shielding of the path A. The latter can be realized, for example by means of comparatively short coaxial envelopes which are axially distributed so that the desired field is realized. For the negative current variation in the paths C steps can be taken to introduce that current variation as described below in connection with FIG. 4. A negative current path can also be dispensed with if a drawback in the form of a larger dispersion field outside the coil is accepted.

FIG. 4 shows a longitudinal wire coupled to circuit 60. Circuit 60 comprises circuits 62 which are composed of capacitive impedances 66 and inductive reactances 64 connected across at least part of the conductors 50. A desired current intensity distribution can thus also be realized. Curve 68 shows the field contribution of the L-C circuit portions of circuit 60 aligned directly above curve 68. Using such a circuit, a negative current path can also be realized. A large number of circuits may be chosen in order to obtain an ideal field distribution, for example, more than from 5 to 7 circuits, but use can also be made of, for example, from 3 or 5 circuits; in that the axial field homogeneity still remains acceptable. For a suitable operation all longitudinal wires of an rf coil must be provided with a current intensity control means possibly with the exception of zero conductors in a bird-cage coil.

We claim:

1. A magnetic resonance apparatus comprising:
   a magnet system for generating a steady magnetic field:
   A gradient magnet system for generating a gradient magnetic field; and
   an rf coil system including an rf coil for generating a magnetic field, said rf coil comprising a set of spaced parallel current carrying conductors extending in a given direction parallel to an axis of symmetry, each conductor of a uniform cross section area along its length, said coil system including means for generating non-constant currents in said conductors along their lengths for producing a given magnetic field between the conductors in the direction of said axis.

2. A magnetic resonance apparatus as claimed in claim 1 wherein the rf coil comprises current conductors which follow, near one or both axial coil ends, paths which diverge from a cylindrical surface and said symmetry axis.

3. A magnetic resonance apparatus as claimed in claim 1 wherein the rf coil comprises locally shielded axially extending conductors for introducing an effectively non-constant current intensity on said conductors in current paths defining a cylinder.

4. A magnetic resonance apparatus as claimed in claim 1 wherein the coil of the rf coil system comprises one or more auxiliary coils for introducing a non-constant current intensity in current paths on said conductors which define a cylinder.

5. A magnetic resonance apparatus as claimed in claim 1 wherein the coil of the rf coil system comprises L-C circuits which are connected across parts of current-carrying, axially extending current conductors.

6. A magnetic resonance apparatus as claimed in claim 5, wherein 3 or more axially successive L-C circuits are provided for each current carrying axial current conductor.

7. A magnetic resonance apparatus as claimed in claim 1 wherein an optimized rf coil thereof is constructed as a bird-cage coil.

8. A magnetic resonance apparatus as claimed in claim 1 wherein said rf coil is constructed as a surface coil.

9. A magnetic resonance apparatus comprising:
   a magnet system for generating a steady magnetic field;
   A gradient magnet system for generating a gradient magnetic field; and
   an rf coil system including an rf coil for generating a magnetic field, said rf coil comprising a set of spaced parallel current carrying conductors extending in a given direction parallel to an axis of symmetry, said coil system including L-C circuits connected across at least part of each of the conductors for generating non-constant currents in said conductors for producing a given magnetic field between the conductors in the direction of said axis.

10. The apparatus of claim 9 wherein said system includes at least three axially successive L-C circuits for each said conductor.

* * * * *